United States Patent
Huang et al.

(10) Patent No.: US 9,647,075 B2
(45) Date of Patent: May 9, 2017

(54) SEGMENTED FIELD PLATE STRUCTURE

(71) Applicant: Freescale Semiconductor, Inc., Austin, TX (US)

(72) Inventors: Jenn Hwa Huang, Chandler, AZ (US); Tianwei Sun, Tempe, AZ (US); James A. Teplik, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/856,154

(22) Filed: Sep. 16, 2015

(65) Prior Publication Data

US 2017/0077245 A1   Mar. 16, 2017

(51) Int. Cl.
*H01L 29/15* (2006.01)
*H01L 29/40* (2006.01)
*H01L 29/78* (2006.01)
*H01L 21/3205* (2006.01)
*H01L 27/06* (2006.01)
*H01L 29/20* (2006.01)
*H01L 29/778* (2006.01)
*H01L 23/485* (2006.01)

(52) U.S. Cl.
CPC ........ *H01L 29/404* (2013.01); *H01L 21/3205* (2013.01); *H01L 29/402* (2013.01); *H01L 29/78* (2013.01); *H01L 23/485* (2013.01); *H01L 27/0623* (2013.01); *H01L 29/2003* (2013.01); *H01L 29/7783* (2013.01); *H01L 29/7787* (2013.01)

(58) Field of Classification Search
CPC ........... H01L 29/2003; H01L 29/66462; H01L 29/7787; H01L 29/7783; H01L 27/0623; H01L 29/1066; H01L 29/4236; H01L 29/402; H01L 29/7813; H01L 29/00; H01L 23/485
USPC ................ 257/194, 48, 76, 77, E21.243, 60, 257/E29.246; 438/105, 931, 186
See application file for complete search history.

(56) References Cited

U.S. PATENT DOCUMENTS

| | | | |
|---|---|---|---|
| 7,915,644 B2 | 3/2011 | Wu et al. | |
| 2011/0095336 A1* | 4/2011 | Zundel | H01L 29/404 257/194 |
| 2013/0032895 A1* | 2/2013 | Disney | H01L 29/7835 257/409 |
| 2013/0168700 A1* | 7/2013 | Furukawa | H01L 29/7805 257/77 |
| 2013/0277741 A1* | 10/2013 | Guowei | H01L 29/402 257/343 |
| 2014/0239346 A1* | 8/2014 | Green | H01L 27/0629 257/192 |

OTHER PUBLICATIONS

Mishra, Umesh K. and Singh, Jasprit, "Semiconductor Device Physics and Design," pp. 401-402, Section 8.7.5, Dordrecht, The Netherlands: Springer, 2008.

* cited by examiner

*Primary Examiner* — Thinh T Nguyen

(57) ABSTRACT

A device includes a transistor formed over a substrate. The transistor includes a source structure, a drain structure, and a gate structure. A dielectric layer is formed over the transistor, and a plurality of vias are electrically connected to the source structure. A metal layer is formed over the dielectric layer. The metal layer includes a field plate over the gate structure, a plurality of contact pads over each via, and a plurality of fingers interconnecting each one of the plurality of contact pads to the field plate.

17 Claims, 6 Drawing Sheets

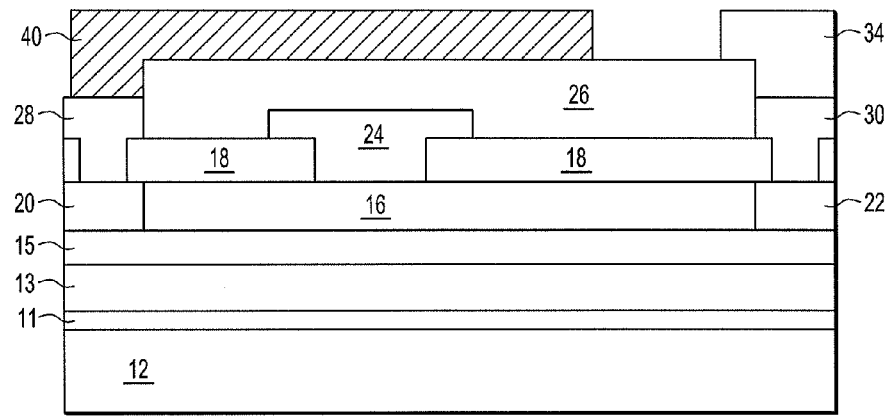
FIG. 2A
- PRIOR ART -
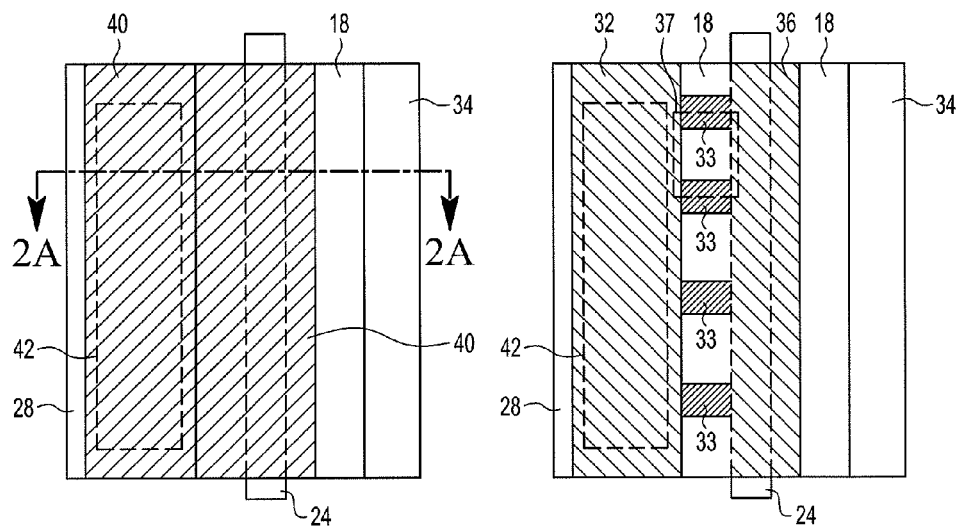
FIG. 2B
- PRIOR ART -
FIG. 2C
- PRIOR ART -

SEGMENTED FIELD PLATE STRUCTURE

FIELD OF USE

The present disclosure describes a field plate design and, specifically, a field plate design implemented in a single metal layer formed between a transistor's gate and source structures or gate and drain structures.

BACKGROUND

A conventional transistor design may have source, drain, and gate structures. The output current of the transistor is modulated by controlling a voltage applied to the transistor's gate structure. In many conventional transistor designs, however, a capacitance forms between the transistor's gate and drain structures, reducing the gain and overall performance of the transistor.

The two main sources of a transistor's gate-to-drain capacitance can be an inter-electrode capacitance between the gate metallization and the drain metallization and a capacitive coupling between the gate and drain structures due to the space charge region in the semiconductor material. The space charge region in the semiconductor material extends from a point beneath the gate structure to the drain of the transistor.

One attempt to reduce this capacitance has been to place a conductor between the gate and drain structures. The conductor is electrically isolated from the substrate of the transistor by a dielectric or insulative layer, and electrically connected to the source. Such a conductive structure can be referred to as a field plate. When an electric potential is supplied to the field plate, the field plate operates to increase the breakdown voltage and reduce the inter-electrode capacitance of the transistor by redistributing the electric field at the gate edge of the transistor such that the gate-drain voltage is dropped across the dielectric layer instead of the semiconductor surface.

In conventional devices, however, difficulties in manufacturing processes have generally required that field plates be implemented as an additional metal layer formed over the transistor device and connected to the device's metal contacts. This implementation complicates both the transistor design and manufacturing process, increasing overall device cost.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where:

FIGS. 2A and 2B illustrate cross-sectional and top views, respectively, of a transistor implementation including a source-connected field plate.

FIG. 2C illustrates a top view of a transistor implementation including a field plate and metal contact connected by a plurality of fingers.

DETAILED DESCRIPTION

Embodiments of the present invention provide an improved field plate design in which the field plate is implemented in a single metal layer formed between a transistor's gate and source structures or gate and drain structures. The new field plate structure can be segmented to include a number of different fingers formed between a field plate and contact pads over the transistor's source or drain. Such an approach may reduce the transistor's gate-to-source or gate-to-drain capacitance resulting in improved operation, possibly at radio frequency (RF) frequencies.

The present field plate structure further enables the field plate structure to be formed as a single metal layer with no closed circular or donut-shaped features, that result during conventional evaporation and lift-off fabrication processes. This simplifies the fabrication process and mitigates problems in the traditional fabrication process. The use of a single metal layer can thereby simplify processing and reduce overall device cost.

In some embodiments, the present field plate structure includes a number of notches or gaps that expose a portion of the transistor's structure (e.g., a portion of the dielectric directly over the underlying gate structure) enabling a thermal measurement to be made of those structures beneath the field plate. Such measurements may be useful in confirming proper operation of the transistor or diagnosing design or fabrication faults.

Figure 1:
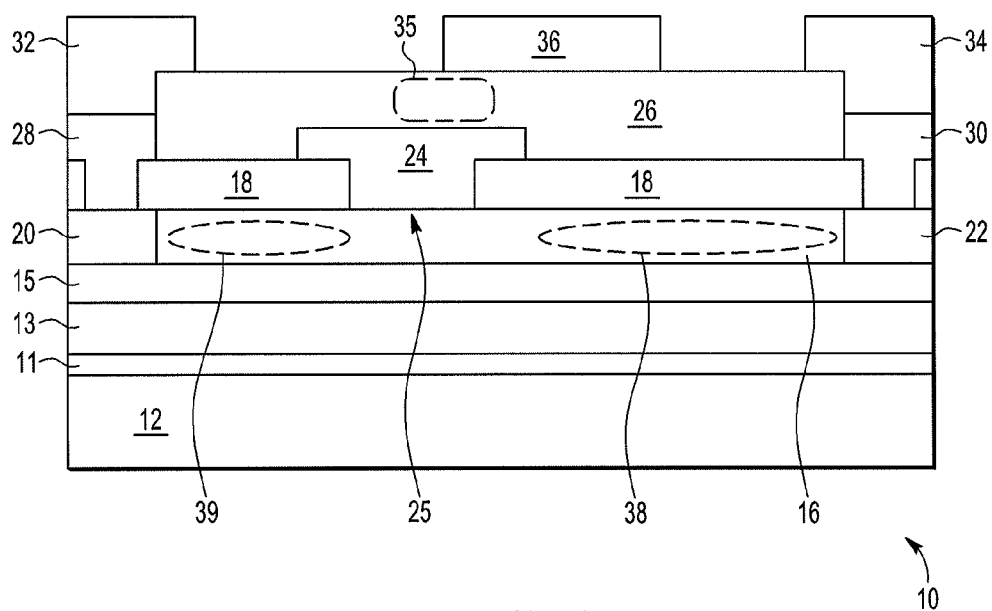
FIG. 1 illustrates a conventional field plate implementation.

FIG. 1 illustrates a transistor employing a conventional field plate. FIG. 1 depicts a cross-sectional view of device 10 including both a transistor and field plate structure overlaying the transistor.

Device 10 includes substrate 12, which may include silicon carbide, sapphire, silicon, gallium nitride (GaN), aluminum nitride, or any other material capable of supporting growth or deposition of semiconductor device materials. In various embodiments, substrate 12 may include nucleation layer 11 formed on substrate 12 to reduce lattice mismatch between substrate 12 and the next layer in the device 10. Nucleation layer 11 can be formed on substrate 12 using known semiconductor growth techniques.

Buffer layer 13 is formed over substrate 12 and nucleation layer 11, with a suitable buffer layer 13 including a high-impedance dielectric material. Channel layer 15, which may include a GaN material, is then formed over buffer layer 13. Barrier layer 16, which may include an aluminum gallium nitride (AlGaN) material, is formed over channel layer 15.

Dielectric layer 18 is formed over barrier layer 16 such that barrier layer 16 is sandwiched between the dielectric layer 18 and channel layer 15. Each of barrier layer 16 and dielectric layer 18 can include one or more doped or undoped layers of dielectric or epitaxial materials, such as one or more layers of different materials including indium gallium nitride (InGaN), AlGaN, aluminum nitride (AlN), or combinations thereof.

Source structure 20 and drain structure 22 may each include doped regions formed over substrate 12 and are in contact with channel layer 15. Gate structure 24 contacts barrier layer 16 at interface 25. Gate structure 24 is formed over dielectric layer 18 between the source structure 20 and drain structure 22. Taken together, source structure 20, drain structure 22, and gate structure 24 form the working elements of a transistor formed over barrier layer 16. In one embodiment, the transistor is a gallium nitride (GaN) field effect transistor (FET). In other embodiments, the transistor may be implemented as a BiFET, or combination of both bipolar and FET, which may be useful in higher-voltage applications. The formation of gate structure 24 may involve etching away a portion of dielectric layer 18 so that gate structure 24 is formed in contact with barrier layer 16.

In this configuration, electric current can flow between the source structure 20 and drain structure 22 when gate structure 24 is biased at an appropriate electric potential. Source structure 20 and drain structure 22 may be formed using evaporation, electrolytic plating, electroless plating, screen printing, physical vapor deposition (PVD), or other suitable deposition processes.

Source structure 20 and drain structure 22 may also be formed by evaporation and lift-off fabrication processes for gold-based ohmic contact metals. The materials can then be alloyed at a proper alloying temperature to form the ohmic source and drain structures 20, 22. Gate structure 24 can also be fabricated using similar techniques such as evaporation and lift-off of suitable metals with a proper work function as compared to GaN-based barrier layer 16.

In various embodiments, gate structure 24 is connected to and contacted at a gate electrode (not shown on FIG. 1). Gate structure 24 may be at least partially recessed into dielectric layer 18 or barrier layer 16.

Dielectric layer 26 is formed over gate structure 24 and dielectric layer 18 between the source structure 20 and drain structure 22. In various embodiments, dielectric layer 26 may include one or more different layers of dielectric materials or a combination of dielectric layers and materials. During fabrication, dielectric layer 26 may be etched such that gate structure 24, source structure 20 and drain structure 22 can be properly formed in contact with barrier layer 16.

Vias 28 and 30 are formed through dielectric layer 26 and 18 and include a metal material. Metal is deposited over each via to form metal contacts 32 and 34. Metal contact 32 may be referred to as the source contact and metal contact 34 may be referred to as the drain contact for the transistor illustrated in FIG. 1. Metal contact 32 is in electrical contact with source structure 20 and metal contact 34 is in electrical contact with drain structure 22. Field plate 36 is formed over dielectric layer 26. Field plate 36 may include the same metal material used to form metal contacts 32 and 34.

Field plate 36 is formed on the dielectric layer 26 over gate structure 24. Field plate 36 is generally formed in close proximity to gate structure 24 (note that the size of dielectric layer 26 is not to scale in FIG. 1 and is, in most applications, a thinner layer). During operation of the transistor, field plate 36 can be subjected to an electric potential. By subjecting field plate 36 to a particular electric potential, the electric field 38 that forms between gate structure 24 and drain structure 22 within barrier layer 16 and the channel layer 15 can be modulated. This modulation may operate to improve the capacitance or increase the breakdown voltage between the transistor's gate structure 24 and drain structure 22, which may, in turn, improve the transistor's linearity, particular in relatively high-frequency (e.g., RF) applications.

As illustrated in FIG. 1, a portion 35 of dielectric layer 26 separates gate structure 24 and field plate 36. This portion 35 of dielectric layer 26 is generally wide enough to isolate field plate 36 from gate structure 24, while being small or thin enough to maximize the field effect provided by field plate 36. If portion 35 is too thick, the field effect can be excessively reduced. In an embodiment according to the present invention, the gap between field plate 36 and gate structure 24 should be approximately 0.4 microns or less, although larger and smaller gaps can also be used.

In various embodiments, field plate 36 may extend different distances from or over the edge of gate structure 24. Field plate 36 may also include many different conductive materials with a suitable material being a metal, or combinations of metals, deposited using standard metallization methods.

In a number of different field plate implementations, approaches have involved constructing a field plate structure that connects to the transistor's source. This is referred to as a source-connected field plate and can result in a reduction of the electric field on the source-to-gate side of the transistor (see region 39). In other transistor designs, however, field plates may be implemented in which the field plate is electrically connected to the transistor's drain. Such a configuration may be referred to as a drain-connected field plate.

In this disclosure, source-connected field plates are generally described and illustrated, but it will be readily understood that the source-connected field plate configurations of the present disclosure could be utilized to implement similarly-configured drain-connected field plates.

FIGS. 2A and 2B illustrate cross-sectional and top views, respectively, of a transistor implementation including a source-connected field plate. FIGS. 2A and 2B show the device of FIG. 1 modified to include the source-connected field plate and, as such, like-numbered elements are the same in each figure. In FIG. 2B, dielectric layer 26 has been hidden to expose structure underlying dielectric layer 26. In FIGS. 2A and 2B, the separate field plate 36 and metal contact 32, which is connected to source structure 20, have been replaced by a single metal structure 40. Dashed line 42 on FIG. 2B represents via 28, which electrically connects metal structure 40 to source structure 20.

The implementation shown in FIGS. 2A and 2B in which the field plate is formed as a singular solid metal block, however, may result in an increased gate-to-source capacitance, which can negatively affect the performance of the transistor, particularly in relatively high-frequency applications, such as RF applications.

To alleviate the increases in gate-to-source capacitance in source-connected field-plate implementations, some designs have called for forming the field plate structure with a number of 'fingers'—thin slivers of conductive materials—that extend towards and connect to the source metal contact.

FIG. 2C shows a top view of such a transistor implementation including a field plate and metal contact connected by a plurality of fingers. FIG. 2C shows a top view of the device of FIG. 1 modified to depict the interconnected metal contact 32 and field plate 36 and, as such, like-numbered elements are the same in each figure. In FIG. 2C, dielectric layer 26 has been hidden to expose structure underlying dielectric layer 26.

A plurality of fingers 33 are formed between source metal contact 32 and field plate 36. The connected fingers 33 provide the desired electrical connectivity between field plate 36 and source metal contact 32, while reducing the increases in gate-to-source capacitance observed in the implementation illustrated in FIGS. 2A and 2B. Using conventional fabrication techniques to form the field plate 36, fingers 33 and metal contact 32, however, lift-off problems may occur in which the metal structures making up the field plate 36 and fingers 33 may separate from one another. These lift-off problems result from the attempt to form the closed (e.g., circular, oval, etc.) metal shapes resulting from the combination of shapes of fingers 33, field plate 36, and source metal contact 32 (indicated by dashed line 37 in FIG. 2C).

Conventional evaporation and lift-off fabrication techniques typically involve forming a number of photoresist islands and then depositing metal over an entire wafer surface around those islands to form the conductive fingers 33. The photoresist can then be removed, along with the metal deposited over the photoresist islands, by soaking the wafer and photoresist in a solvent. But due to variations in the height, area, and pattern of the photoresist islands, some of the metal may be difficult to "lift-off" with the photoresist islands. When the photoresist is ultimately removed, the metal that flowed over and around portions of the photoresist that would otherwise make up the conductive fingers 33, may also be removed, resulting in gaps or openings in the fingers' metal structure. Because of these difficulties, in conventional foundry processes, shapes such as circles or donuts (i.e., features that are formed by the multiple fingers interconnecting the field plate and metal source contact in a conventional arrangement—see dashed line 37 of FIG. 2C) are not allowed as they are too difficult to form accurately.

The problems associated with these lift-off fabrication processes may be mitigated, somewhat, by only connecting the field plate and source metal contact by a small number of fingers (e.g., two fingers formed at the edges of the field plate and source terminal structures). But such implementations increase the overall series resistance of the structure, which can, in turn, create phase delay problems if the transistor is used in relatively high-frequency applications.

In conventional devices, an entirely separate metal layer is formed over the source metal contact in order to interconnect the field plate and source metal contact structures. The use of the separate metal layer results in a metal configuration that does not include the circle or donut shape depicted in FIG. 2C, thereby mitigating the lift-off processing problems described above.

Figure 3A:
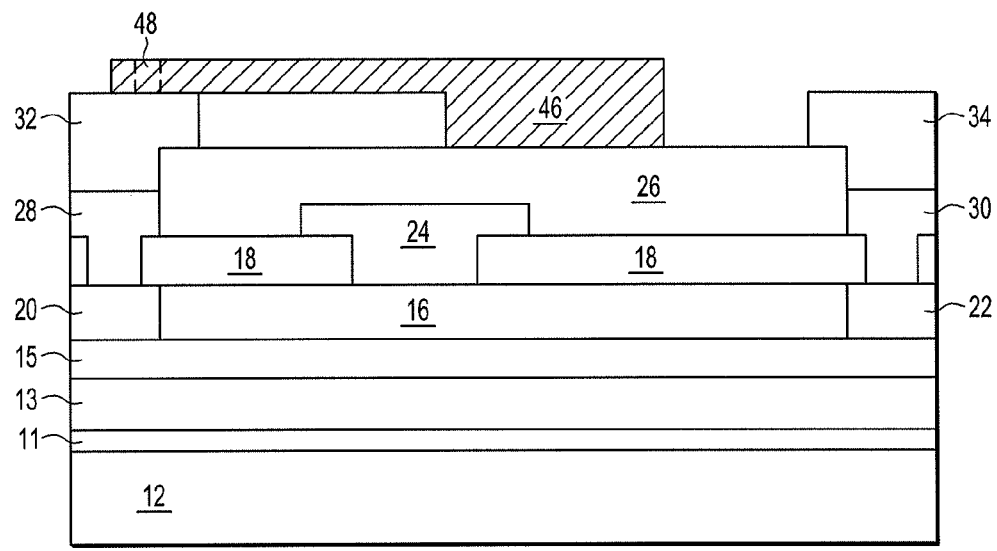
FIGS. 3A and 3B illustrate cross-sectional and top views, respectively, of a transistor implementation including a source-connected field plate, where a separate metal layer forms the connection between field plate and source structure.
Figure 3B:
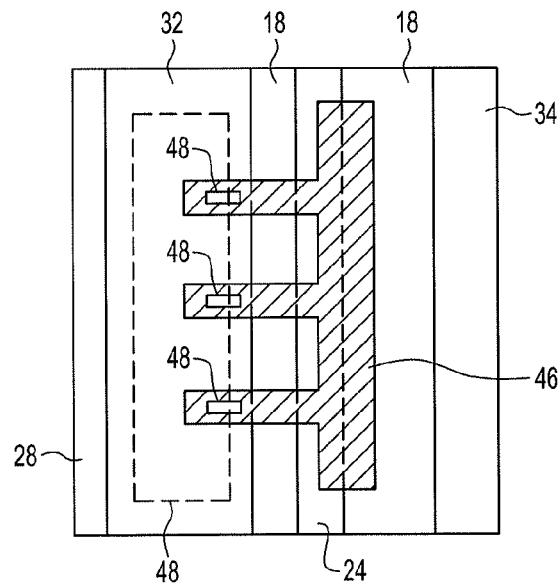

To illustrate, FIGS. 3A and 3B, shows cross-sectional and top views, respectively, of a transistor implementation including a source-connected field plate, where a separate metal layer forms the connection between field plate and source structure. FIGS. 3A and 3B show the device of FIG. 1 modified to include the source-connected field plate and, as such, like-numbered elements are the same in each figure. Note that in FIG. 3B, dielectric layer 26 has been hidden to expose structure underlying dielectric layer 26.

In FIGS. 3A and 3B, metal contact 32 is formed in the same manner as the same metal contact shown in FIG. 1. But in this implementation a separate metal layer 46 is formed over gate structure 24 to form the field plate. Metal layer 46, as shown in FIG. 3B, includes a number of separate fingers that extend over and connected to metal contact 32. A number of vias 48 can be formed within or through the fingers of metal layer 46 to put metal layer 46 and metal contact 32 into electrical contact.

This arrangement, although forming the desired source-connected field plate structure and mitigating the lift-off fabrication problems described above, requires that an additional metal layer (layer 46) be formed over the device. Such an approach adds complication to the fabrication process, requiring an additional step to form the additional metal layer, resulting in increasing manufacturing time and expense.

Figure 4A:
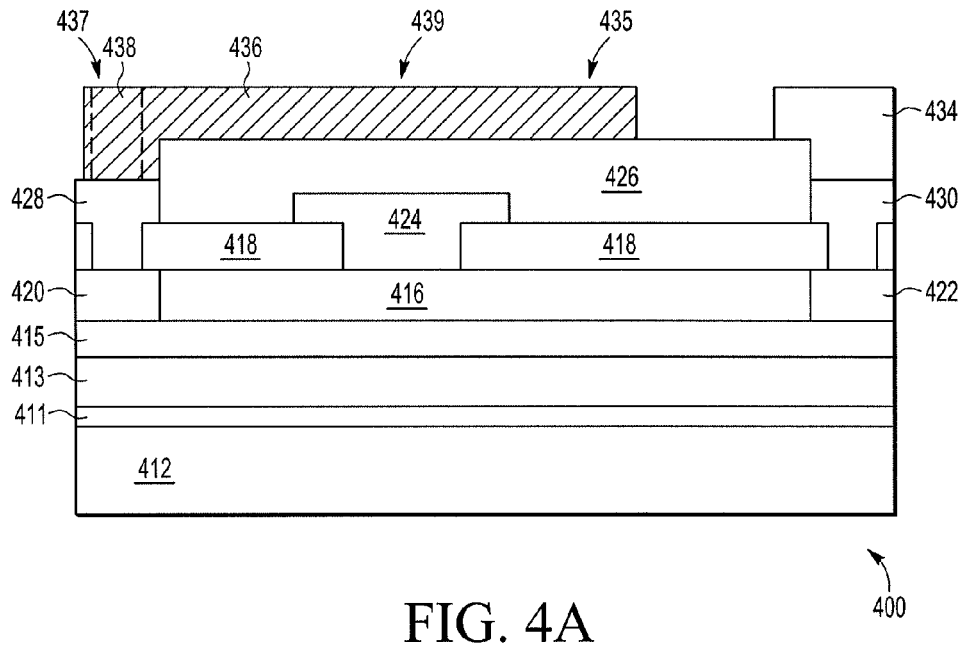
FIGS. 4A and 4B show cross-sectional and top views, respectively, of a transistor device including a source-connected field plate in accordance with the present disclosure.
Figure 4B:
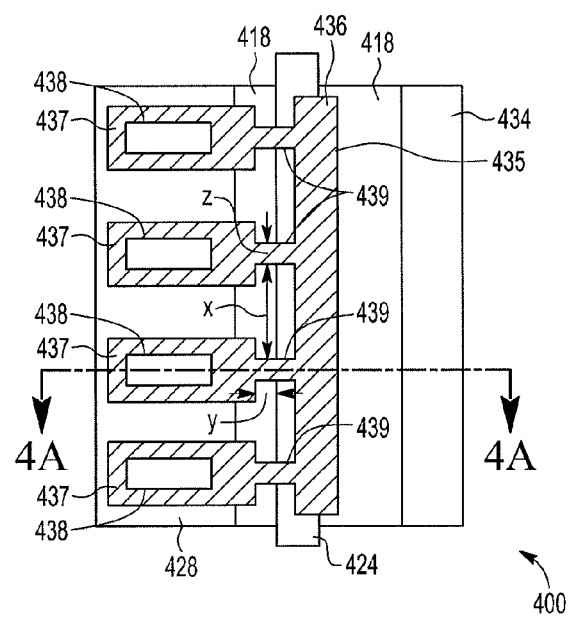

In contrast, FIGS. 4A and 4B show cross-sectional and top views, respectively, of a transistor device including a source-connected field plate formed in a single metal layer in accordance with embodiments of the present invention. In FIG. 4B, dielectric layer 426 has been hidden to expose structure underlying dielectric layer 426. Device 400 includes substrate 412, which may include silicon carbide, sapphire, silicon, gallium nitride, or aluminum nitride. In various embodiments, substrate 412 may include nucleation layer 411 to reduce lattice mismatch between substrate 412 and the next layer in the device 400.

Buffer layer 413 is formed over substrate 412 and nucleation layer 411, with a suitable buffer layer 413 including a high-impedance dielectric material. Channel layer 415 is over buffer layer 413. Barrier layer 416, which may include AlGaN, is formed over channel layer 415.

Barrier layer 416 is formed over buffer layer 413, with a suitable barrier layer 416 including a high-impedance dielectric material. Dielectric layer 418 is formed over barrier layer 416 such that barrier layer 416 is sandwiched between dielectric layer 418 and buffer layer 413. Each of barrier layer 416 and dielectric layer 418 can include one or more doped or undoped layers of dielectric or epitaxial materials. Source structure 420 and drain structure 422 are formed over substrate 412. Gate structure 424 is formed over dielectric layer 418 between source structure 420 and drain structure 422. The formation of gate structure 424 may involve etching away a portion of dielectric layer 418 so that gate structure 424 is formed in contact with barrier layer 416.

In this configuration, electric current can flow between source structure 420 and drain structure 422 when gate structure 424 is biased at an appropriate electric potential. Source structure 420 and drain structure 422 may be formed using evaporation, electrolytic plating, electroless plating, screen printing, PVD, or other suitable metal deposition process.

In various embodiments, gate structure 424 is connected to and contacted at a gate electrode (not shown on FIG. 4A). In other embodiments gate structure 424 can be at least partially recessed into dielectric layer 418 or barrier layer 416.

Dielectric layer 426 is formed over gate structure 424 and dielectric layer 418 between source structure 420 and drain structure 422. In various embodiments, dielectric layer 426 may include one or more different layers of dielectric materials or a combination of dielectric layers and materials.

Vias 428 and 430 are formed through dielectric layer 418 and 426 and include metal. Metal is formed over and within via 430 to form metal contact 434, which is electrically connected to drain structure 422.

Metal layer 436 is formed over dielectric layer 426. Metal layer 436 may include the same metal material used to form metal contact 434 and may be formed in the same step as that in which contact 434 is formed. Metal layer 436 may be formed as the same metal layer that would have ordinarily been used to form the transistor's source contact.

Metal layer 436 is patterned to include field plate 435 located over at least a portion of gate structure 424, a plurality of separated or segmented contact pads 437, and a plurality of fingers 439 connecting each contact pad 437 to field plate 435. Each one of the plurality of fingers 439 may connect to one and only one contact pad 437. Each contact pad 437 is connected to a via 438 which is, in turn, connected to source structure 420. In one embodiment, contact pads 437 of metal layer 436 may be wider than fingers 439, though the size and shape of contact pads 437 may vary depending upon design. In this configuration, field plate 435, fingers 439, and contact pads 437 are not formed separately and joined together. Instead, field plate 435, fingers 439, and contact pads 437 are formed integrally by patterning a single metal layer.

Because contact pads 437 are each separated from one another, the combination of contact pads 437, fingers 439 and field plate 435 do not form the closed structures that are difficult to form using lift-off fabrication techniques, as described above. Accordingly, the problems associated with forming devices incorporating circle or donut-shaped metal structures in conventional field plate designs are not present in device 400 and device 400 may be fabricated using conventional techniques.

Field plate 435 is generally formed in close proximity to gate structure 424. During operation of the transistor, field plate 435 can be subjected to an electric potential. By subjecting field plate 435 to a particular electric potential, the electric field that forms between gate structure 424 and drain structure 422 within dielectric layer 426 during operation of device 400 can be modulated. This modulation may operate to improve or increase the breakdown voltage between the transistor's gate structure 424 and drain structure 422, which may, in turn, improve the transistor's linearity, particular in relatively high-frequency applications.

The segmented field plate structure depicted in FIG. 4B, including field plate 435, fingers 439, and contact pads 437, may be formed within the same metal layer 436, which may, or may not, be formed in the same step as the formation of metal contact 434. Fingers 439 can be separated, in one embodiment, by a distance x of about 50 micrometers (um). Fingers 439 may have a width z, in one embodiment, of about 5 um to 10 um. In such a configuration, fingers 439 may extend to the left (as illustrated in FIG. 4B) past the left hand edge of gate structure 424 by a distance y of about by 2 um.

Because a single metal layer 436 includes field plate 435, fingers 439, and contact pads 437, the arrangement shown in FIGS. 4A and 4B may simplify the overall fabrication process for device 400, potentially reducing cost and improving quality. Additionally, by forming the components as a single metal layer and segmenting the contact pads 437 of metal layer 436 overlaying source structure 420 into several sections, the lift-off problems associated with conventional approaches of connecting metal contact 32 and field plate 36 (see FIGS. 3A and 3B) may be mitigated. Because metal layer 436 is implemented with a number of fingers 439, gate-to-source capacitance for device 400 can be reduced compared to conventional devices, improving overall device 400 performance.

In some embodiments of the present field plate design, portions of the field plate may be notched or etched to form gaps exposing at least a portion of the underlying device. These gaps can allow thermal measurements to be made of the exposed portions of the device through the field plate. The measurements could be made, for example, using an infra-red temperature measurement device. As discussed below, the temperature measurements could be used to confirm proper operation of the overall device or to diagnose problems either in a particular device or associated with an overall device design.

Figure 5A:
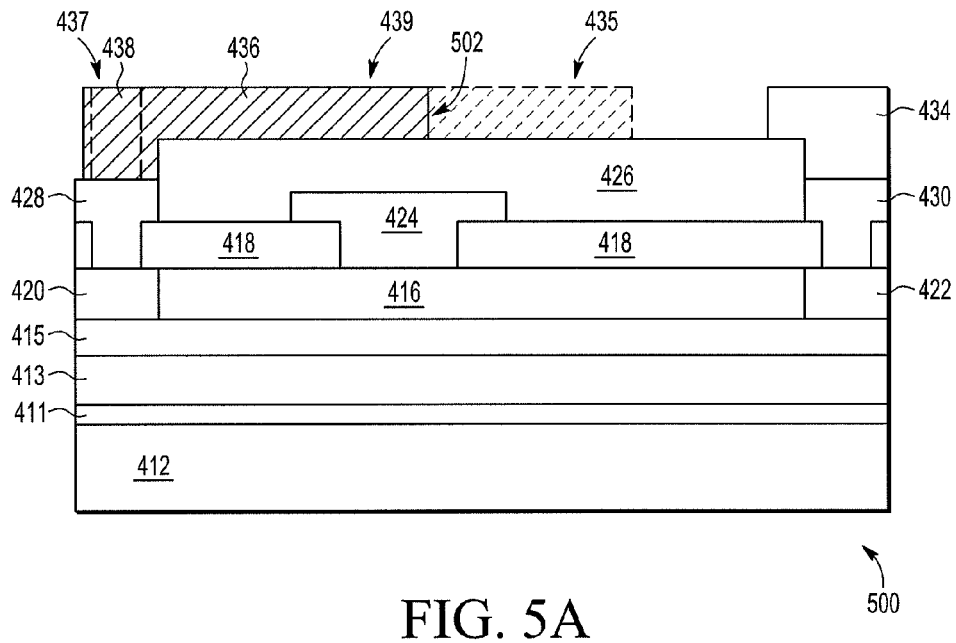
FIGS. 5A and 5B show cross-sectional and top view, respectively, of the device of FIGS. 4A and 4B, where the field plate includes a gap or notch to expose an underlying portion of the device.
Figure 5B:
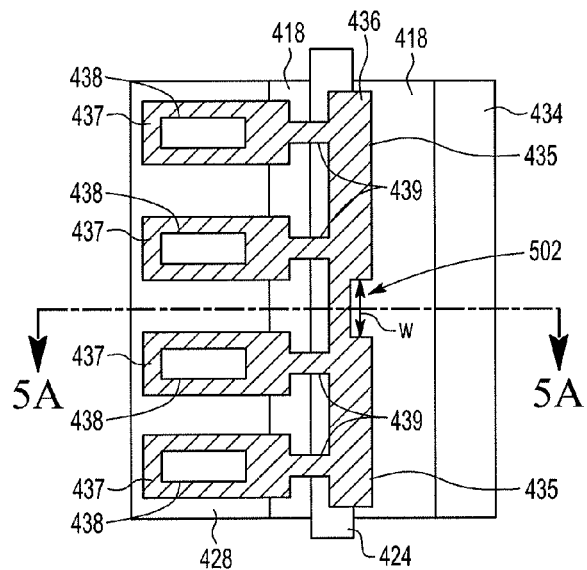

FIGS. 5A and 5B show cross-sectional and top views, respectively, of the device of FIGS. 4A and 4B, where the field plate includes a gap or notch to expose an underlying portion of the device. In FIG. 5B, dielectric layer 426 has been hidden to expose structure underlying dielectric layer 426. As illustrated, field plate 435 includes notch 502. Notch 502 only partially extends into field plate 435 and, as such, field plate 435 depicted in FIGS. 5A and 5B is formed as a single structure.

Depending upon implementation of device 500, any number of notches 502 may be formed along the length of field plate 435. If multiple notches 502 are formed, all of the notches may be formed on the same side of field plate 435, or the notches may be formed on opposing sides of field plate 435. Notches 502 may be formed towards the distal ends and middle of field plate 435 (each notch 502 overlaying the distal ends and middle of gate structure 424). In one embodiment, for example, notches 502 are formed within about 10 um of a first end of field plate 435, at a middle point of field plate 435, and within about 10 um of a second end of field plate 435. Such a configuration would allow the monitoring of a temperature distribution along a length of gate structure 424 by taking measurements towards each end and the middle of gate structure 424.

To enhance the temperature measurements for a particular device, field plate 435 may include a larger number of notches 502 formed at regular intervals along a length of field plate 435. Then, by taking a measurement at each notch, it would be possible to determine a temperature variation along the length of gate structure 424. Such data could also provide useful data in evaluating the operation of a particular transistor device.

A width w of notch 502 may be at least about 5-10 um and may be at least partially determined by a capability of a measuring apparatus utilized to take temperature measurements through notch 502. In various configurations, the size and shape of notch 502 will be determined by a corresponding impact on electrical performance on device 500.

In a number of embodiments in which field plate 435 includes a number of notches 502, the length ratio of notches 502 to field plate 546 can be minimized to a target value (e.g., 0.2), and might be varied depending on transistor design and electrical performance. The length ratio may be a ratio of the sum of all widths of all notches 502 in field plate 435 to the overall length of field plate 435.

When the present field plate structure is implemented in a FET, notches 502 may be generally constrained to a central area of the FET transistor. By locating notches 502 over a central region of the transistor, a suitably-configured IR microscope may more easily capture the transistor's maximum gate structure temperature. In some cases, notches 502 may also be formed along an edge of the transistor if it is desirable to monitor the operation temperature at the transistor's edge, since a transistor having uniform temperature distribution across all the gate fingers may have improved thermal stability and less probability of thermal hot spots and thermal runaway.

As mentioned above, notch 502 enables the making of temperature measurement of the portions of device 500 exposed by notch 502. In the example shown in FIG. 5B, notch 502 is formed so that when viewed from above (the view depicted in FIG. 5B), a portion of gate structure 424 is located directly beneath notch 502. In an actual device, dielectric layer 426 would be formed over gate structure 424, thereby obscuring gate structure 424. But, because dielectric layer 426 is relatively thin, the presence of dielectric layer 426 would not significantly interference with thermal measurements of the portion of gate structure 424 underlying notch 502.

The thermal measurements made using notch 502 may be useful in testing and verifying the proper operation of device 500. For example, in transistor devices such as GaN devices, the majority of heat dissipation may usually occur in an extremely confined region on the drain side of the transistor's gate. In conventionally arranged devices, this confined region would be hidden underneath the device's field plate. As such, infrared radiation emitted from this region is generally blocked by the field plate making this region immeasurable by devices such as infra-red thermometers. In that case, temperature measurements can only be made of the field plate surface, which may not accurately reflect the temperature of the underlying gate structure. Similarly, thermo-reflectance temperature measurement techniques may be unable to measure the temperature of the gate structure.

In other embodiments, notches 502 may be replaced by holes or windows that are formed within a central region of field plate 435, where the hole or window is configured to enable thermal measurement of structure underlying field plate 435. In such an implementation, the holes or windows may be configured to be at least about 5-10 um wide to enable thermal measurements to be taken.

In contrast to conventional devices, therefore, the segmented field plate structure illustrated in FIGS. 5A and 5B would enable thermal measurement of transistor gate temperatures in GaN transistor devices via infra-red and thermo-reflectance technique by exposing the hot region to determine the device's thermal resistance (Rth) and temperature. These measurements can then be used to evaluate transistor device design and make predictions for a particular device or family of devices, such as mean time to failure, for various device configurations.

In still further embodiments, the field plate structure may be formed as part of a single metal layer that is patterned into a number of distinct metal structures or portions that each individually overlap the transistor's gate and source structures.

Figure 6:
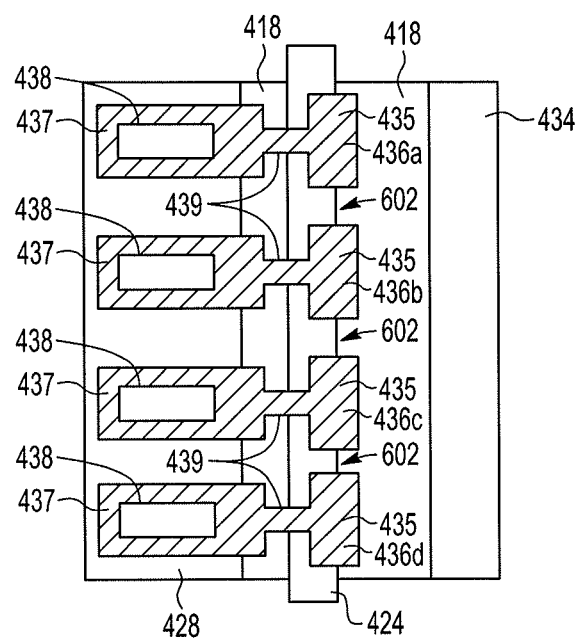
FIG. 6 shows a top view of the device of FIG. 4B, in which the field plate is formed in a number of separate portions.

FIG. 6 shows a top view of the device of FIG. 4B, where the metal layer is formed in a number of separate structures 436a-d. Each structure 436a-d of metal layer 436 may be formed by extending one or more notches (see FIG. 5) through metal layer 436 to create gaps 602 through which temperature measurements can be made of the underlying structure. In the example shown in FIG. 6, gaps 602 are formed so that when viewed from above (the view depicted in FIG. 6), portions of gate structure 424 are positioned directly underneath at least a portion of each gap 602. In an actual device, of course, dielectric layer 426 would be formed over gate structure 424, thereby obscuring gate structure 424. But, because dielectric layer 426 is relatively thin, the presence of dielectric layer 426 would not significantly interference with thermal measurements of the portions of gate structure 424 underlying each gap 602.

Each structure 436a-d of metal layer 436 may be formed by patterning (e.g., using evaporation and lift-off techniques) a single metal layer over device 600. This allows each structure 436a-d to be formed at the same time or in the same manufacturing step, simplifying the manufacturing process in comparison with conventional approaches.

In conclusion, systems, devices, and methods configured in accordance with example embodiments of the invention relate to:

A device including a transistor formed over a substrate. The transistor includes a source structure, a drain structure, and a gate structure. The device includes a dielectric layer over the transistor, and a plurality of vias electrically connected to the source structure. The device includes a metal layer over the dielectric layer. The metal layer includes a field plate over the gate structure, a plurality of contact pads over each via, and a plurality of fingers interconnecting each one of the plurality of contact pads to the field plate.

A device including a transistor formed over a substrate, a dielectric layer over the transistor, and a metal layer over the dielectric layer. The metal layer includes a plurality of contact pads electrically connected to a first structure of the transistor, a metal contact electrically connected to a second structure of the transistor, and a field plate. The field plate is electrically connected to the plurality of contact pads and not electrically connected to the metal contact.

A method including forming a transistor over a substrate, depositing a dielectric layer over the transistor, depositing a metal layer over the dielectric layer, and patterning the metal layer to form a field plate over a gate structure of the transistor, a plurality of contact pads connected to a source structure of the transistor, and a plurality of fingers interconnecting each one of the plurality of contact pads to the field plate.

For simplicity and clarity of illustration, the drawing figures of the present disclosure illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. A device, comprising:
   a transistor formed over a substrate, the transistor includes a source structure, a drain structure, and a gate structure;
   a dielectric layer over the transistor;
   a plurality of vias electrically connected to the source structure; and
   a metal layer over the dielectric layer, the metal layer including:
      a field plate over the gate structure, the field plate including a notch over the gate structure,
      a plurality of contact pads over each via, and
      a plurality of fingers interconnecting each one of the plurality of contact pads to the field plate.

2. The device of claim 1, wherein each one of the plurality of fingers is directly connected to one and only one of contact pads.

3. The device of claim 1, wherein each one of the plurality of fingers has a width of about 5 um to 10 um.

4. The device of claim 1, wherein the plurality of fingers are separated from one another by at least about 5 um.

5. The device of claim 1, wherein the notch has a width of about 5 um to 10 um.

6. The device of claim 1, wherein the metal layer forms a metal contact over the substrate, the metal contact being electrically connected to the drain structure.

7. The device of claim 1, wherein the transistor is a gallium nitride field effect transistor.

8. A device, comprising:
   a transistor formed over a substrate;
   a dielectric layer over the transistor; and
   a metal layer over the dielectric layer, the metal layer including:
      a plurality of contact pads electrically connected to a first structure of the transistor,
      a metal contact electrically connected to a second structure of the transistor, and
      a field plate, the field plate being electrically connected to the plurality of contact pads and not electrically connected to the metal contact, the field plate including a notch over a gate structure of the transistor.

9. The device of claim 8, wherein the plurality of contact pads, metal contact, and field plate are formed by patterning the metal layer.

10. The device of claim 8, wherein the metal layer includes a plurality of fingers connecting the field plate to each of the plurality of contact pads.

11. The device of claim 10, wherein each one of the plurality of fingers has a width of about 5 um to 10 um.

12. The device of claim 10, wherein each one of the plurality of fingers are separated by at least about 5 um.

13. The device of claim 8, wherein the field plate defines an opening over a third structure of the transistor.

14. The device of claim 13, wherein the opening has a width of about 5 um to 10 um.

15. The device of claim 8, wherein the notch has a width of about 5 um to 10 um.

16. The device of claim 8, wherein the transistor is a gallium nitride field effect transistor.

17. The device of claim 8, wherein the first structure is characterized as a source structure of the transistor, and the second structure is characterized as a drain structure of the transistor.

* * * * *